United States Patent [19]

Smith et al.

[11] Patent Number: 5,678,287
[45] Date of Patent: Oct. 21, 1997

[54] USES OF UNIAXIALLY ELECTRICALLY CONDUCTIVE ARTICLES

[75] Inventors: Nicholas J. G. Smith, Cricklade; Michael Joseph Ludden, Swindon; Peter Nyholm, Swindon; Paul James Gibney, Swindon, all of England

[73] Assignee: Raychem Limited, Swindon, United Kingdom

[21] Appl. No.: 469,347

[22] Filed: Jun. 6, 1995

Related U.S. Application Data

[62] Division of Ser. No. 368,256, Jan. 3, 1995, Pat. No. 5,631,447, which is a continuation of Ser. No. 173,602, Dec. 27, 1993, abandoned, which is a continuation of Ser. No. 548,963, Feb. 26, 1991, abandoned.

[30] Foreign Application Priority Data

| Feb. 5, 1988 | [GB] | United Kingdom | 8802565 |
|---|---|---|---|
| Jun. 29, 1988 | [GB] | United Kingdom | 8815447 |
| Aug. 22, 1988 | [GB] | United Kingdom | 8819895 |
| Sep. 30, 1988 | [GB] | United Kingdom | 8823053 |
| Dec. 2, 1988 | [GB] | United Kingdom | 8828245 |

[51] Int. Cl.$^6$ .................................................. H05K 3/34
[52] U.S. Cl. ............................. 29/840; 228/180.22
[58] Field of Search ................. 29/825, 830, 831; 439/91; 228/180.22

[56] References Cited

U.S. PATENT DOCUMENTS

| 3,758,705 | 9/1973 | Schmid | 174/113 R |
|---|---|---|---|
| 3,832,769 | 9/1974 | Olyphant | 29/626 |
| 4,169,001 | 9/1979 | Kaiser | 156/89 |
| 4,252,990 | 2/1981 | Sado | 174/52 R |
| 4,332,341 | 6/1982 | Minetti | 228/180 A |
| 4,563,543 | 1/1986 | Kersh zanetal | 174/68.5 |
| 4,610,758 | 9/1986 | Wilson | 156/656 |
| 4,622,058 | 11/1986 | Leary-Renick | 65/105 |
| 4,630,096 | 12/1986 | Drye | 357/81 |
| 4,642,421 | 2/1987 | Dery | 174/88 R |
| 4,649,338 | 3/1987 | Dugan | 324/158 P |
| 4,667,219 | 5/1987 | Lee | 357/68 |
| 4,737,112 | 4/1988 | Jin | 439/66 |
| 4,740,657 | 4/1988 | Tsukagoshi | 174/88 R |
| 4,783,722 | 11/1988 | Osaki | 361/411 |
| 4,803,595 | 2/1989 | Kraus | 361/412 |
| 5,051,359 | 9/1991 | Arnio et al. | 439/91 |

FOREIGN PATENT DOCUMENTS

| 160236 | 11/1985 | European Pat. Off. . |
|---|---|---|
| 183598 | 4/1986 | European Pat. Off. . |
| 0213774 | 8/1986 | European Pat. Off. . |
| 171232 | 12/1986 | European Pat. Off. . |
| 229850 | 7/1987 | European Pat. Off. . |
| 213774 | 11/1987 | European Pat. Off. . |
| 245179 | 11/1987 | European Pat. Off. . |
| 260490 | 3/1988 | European Pat. Off. . |
| 914839 | 1/1963 | United Kingdom . |
| 1262787 | 2/1972 | United Kingdom . |
| 1284481 | 8/1972 | United Kingdom . |
| 1311659 | 3/1973 | United Kingdom . |
| 2017408 | 10/1979 | United Kingdom . |
| 1587416 | 4/1981 | United Kingdom . |
| 2149980 | 6/1985 | United Kingdom . |
| WO 87/04316 | 7/1987 | WIPO . |

*Primary Examiner*—P. W. Echols
*Assistant Examiner*—Adrian L. Coley
*Attorney, Agent, or Firm*—Herbert G. Burkard; Sheri M. Novack

[57] ABSTRACT

Polymer (preferably polyimide) sheets with laser ablated through-holes plated with metal are used for making electrical connections to specified microcircuits, especially unbumped microchips and Tape Automated Bonding (TAB) articles. Bonding with different melting-point materials at opposite ends of the plated holes is disclosed. Preferred polyimides are those derived from polymerisation of 4-4'-biphenyldianhydride and (4,4'-diaminobiphenyl, or 4,4'-diaminobiphenylether, or phenylenediamine, preferably p-phenylenediamine).

31 Claims, 10 Drawing Sheets

FIG. 3
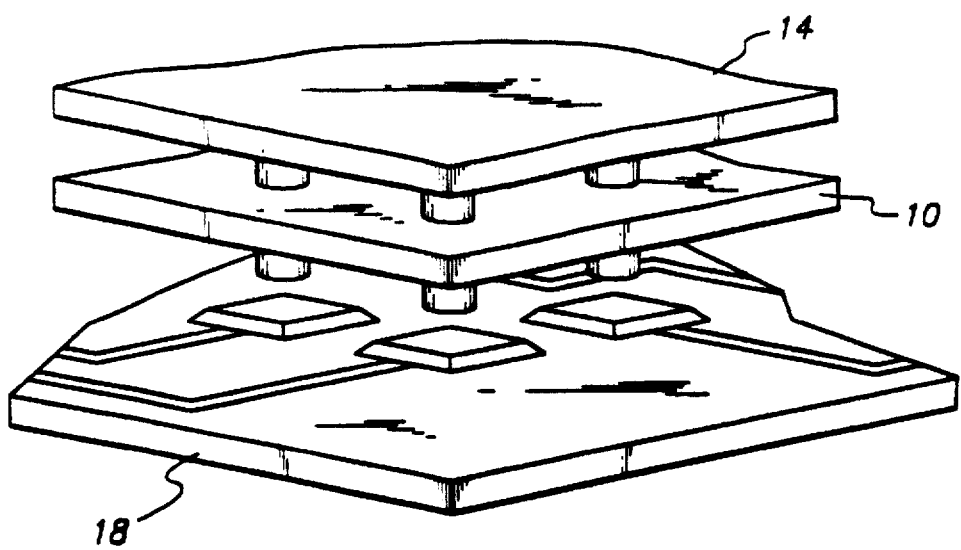
FIG. 4
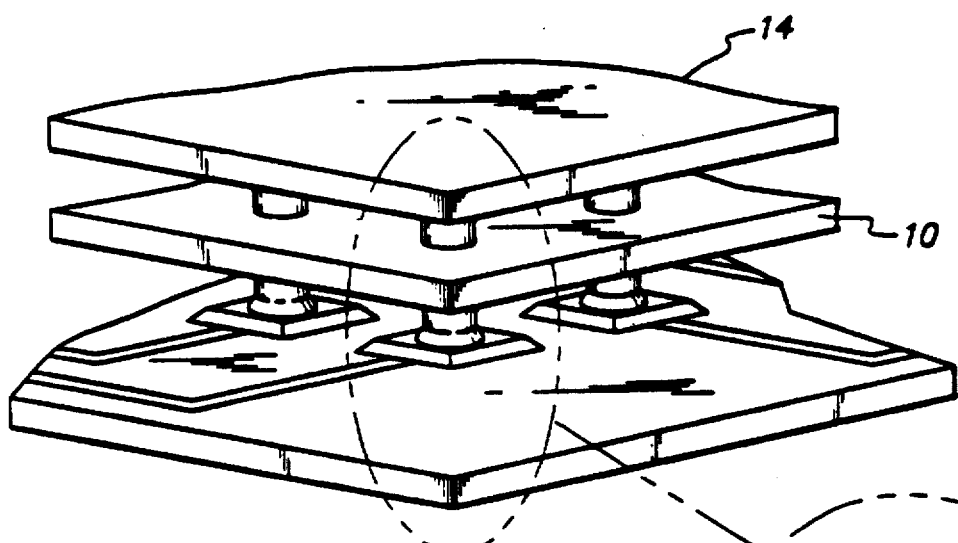
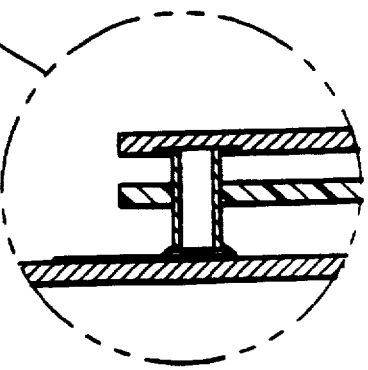
FIG. 4A

USES OF UNIAXIALLY ELECTRICALLY CONDUCTIVE ARTICLES

This application is a divisional application of U.S. Ser. No. 08/368,256 filed Jan. 3, 1995, now U.S. Pat. No. 5,631,447, which is a continuation of U.S. Ser. No. 08/173,602, filed Dec. 27, 1993, now abandoned, which is a continuation of U.S. Ser. No. 07/548,963 filed Feb. 26, 1991, now abandoned.

BACKGROUND OF THE INVENTION

1. Field of the Invention

This invention relates to new practical applications of uniaxially electrically conductive articles, and to special forms of such article for use therein.

2. Description of the Related Art

It is known from U.S. Pat. No. 3,303,085 to produce porous mica sheets in which relatively straight-line through-holes of 5 to 20,000 ÅAngstroms diameter, produced by heavy particle radiation followed by etching of the mica, are simply filled with superconductive material or iron particles to provide oriented single domain ferromagnetic sheet, or with material suitable for imaging in television cameras. The surfaces of the mica sheet may be polished or abraded to assure electrical contact with the conductive filler.

Porous polymer sheets in which selected areas of the interconnecting through-holes are masked and the unmasked through-holes are metal plated to provide electrically conductive spots surrounded by insulating areas, are known from Japanese Published Patent Application 80161306.

SUMMARY OF THE INVENTION

Published EP-A-0213774 describes a superior form of uniaxially electrically conductive article comprising porous electrically insulating sheet material at least a selected portion of which has at least 25 substantially non-interconnected through-holes per square millimeter of its surface, at least a significant proportion of which through-holes individually contain electrically conductive material which provides an electrically conductive path between, and projects beyond at least one of, the main surfaces of the sheet material, each such conductive path being electrically separate from substantially all of the other such conductive paths.

The preferred forms of uniaxially electrically conductive article for all aspects of the present invention are those supplied by Raychem Limited, for example as described in the aforementioned EP-A-0213774 or as described in copending British Patent Applications 8802567, 8802566, 8802568. For convenience, the description of the present invention hereinafter will refer to uniaxially conductive sheets, it being understood, however, that the invention is not limited to the use of those specific preferred forms of uniaxially conductive article.

Formation of the conductive article by laser drilling of through-holes in polymer sheets, especially by U.V. laser ablation (ablative photodecomposition), has advantages in producing a relatively low degree of taper in the holes compared with other perforating techniques such as etching with liquids or reactive gases. The lower taper permits closer pitch between through-holes. This is clearly advantageous, given that microcircuits are becoming progressively smaller and more densely patterned. Through-holes with taper (measured between the substantially straight inner surface of the hole and the axis of the hole) less than 10°, preferably less than 8°, more preferably less than 6°, and especially less than 4° can advantageously be achieved by laser drilling of suitable polymer sheets, and may usefully be incorporated in all aspects of the invention described herein.

BUMP-FREE BONDING

One application according to this invention provides a method of making substantially permanent electrical connections between connection sites on a first substrate and corresponding connection sites on a second substrate, comprising:

(a) aligning the connection sites of first substrate face to face with the corresponding connection sites on the second substrate, (b) placing between the facing substrates a uniaxially electrically conductive article comprising electrically insulating sheet material with at least one through-hole aligned between each pair of facing connection sites, the through-holes being internally plated with electrically conductive material which provides an electrically conductive path between, and projects beyond, the main surfaces of the sheet material and including bonding material capable of bonding to the connection site, and (c) bonding the end of the electrically conductive material in the through-holes to the respective corresponding pairs of facing connection sites, one or both of the connection sites in each pair prior to the bonding being substantially free of fusible bonding material.

Preferably, the electrically conductive material comprises a tube of the plated metal in each through-hole. The bonding material, at least at one end of each through-hole, may be solder (e.g. held in a tube of plated metal), or may be gold, preferably plated to a thickness of at least 1.5, more preferably at least 2 micrometers. Gold, especially at thicknesses of 2 micrometers or more (e.g. 2.5, 3, or 3.5 micrometers), can advantageously be bonded to chip connection sites by thermocompression bonding without the inconvenience of first having to apply solder "bumps" to the connection sites.

The uniaxial sheet may be constructed with only one through-hole containing the electrically conductive material between pairs of facing connection sites, e.g. on a chip and a circuit board, in which case the size of the through-holes will preferably be chosen to suit the size of the connection sites. Alternatively, there may be two or more small through-holes independently containing the electrically conductive material between each pair of connection sites. In either case, the sheet may have substantially no other conductive through-holes, thus providing a single "one-to-one" pattern of conductive paths (one path or one group of paths for each pair of connection sites) as described in the aforementioned copending application; or the sheet may have two or more such "one-to-one" patterns interspersed with each other for selective use as also described in copending International Application No. PCT/GB89/00110 filed on Feb. 3, 1989 entitled "Uses of Uniaxially Electrically Conductive Articles" (RK360COM); or the sheet may have a multitude of conductive through-holes as described in the aforementioned EP-A-0213774 for random alignment between the facing pairs of connection sites; always provided that any conductive through-holes not acting between the facing pairs of connection sites do not interfere unacceptably with the operation of the resulting assembly of a first substrate (preferably a microcircuit chip) substantially permanently electrically connected to a second substrate by this method.

Uniaxially conductive sheets can thus be used to bond chips (and other active devices, for example liquid crystal displays) permanently to circuit boards, chip carriers, or even to other chips.

Known technology of this kind includes IBM's "flip chip", in which method, solder balls are formed on the chip's bond pads, the chip is flipped upside down and aligned with the tracks on a circuit board, and the solder is reflowed to make a joint. This method has the advantage of having a very small "footprint" (no larger than the chip itself), but a major drawback of "flip chip" is the tendency of the solder bonds to shear on thermal cycling. This is because the chip (made of silicon) often has a different thermal expansion coefficient from the substrate it is attached to (a glass-epoxy board, for example). Thus the two components expand and contract by different amounts, and a failure occurs. Flip chip is also unpopular because a further processing step is required to place solder bumps on IC bonding pads.

BRIEF DESCRIPTION OF THE DRAWINGS

In the accompanying drawings.

FIG. 3 illustrates the FIG. 2 uniaxially conductive article bonded by thermocompression to the "flip chip", before bonding to a hybrid circuit board or multichip module.

FIG. 4 shows the FIG. 3 assembly after bonding by solder reflow to the hybrid board or module.

Figure 1:
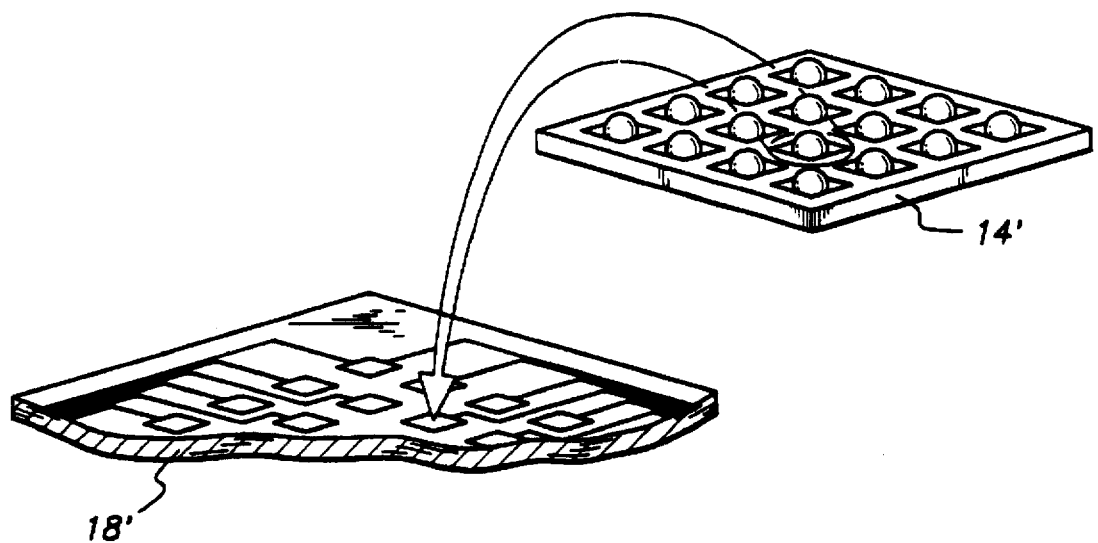
FIG. 1 illustrates a solder-bumped chip in a known "flip chip" assembly.
Figure 2:
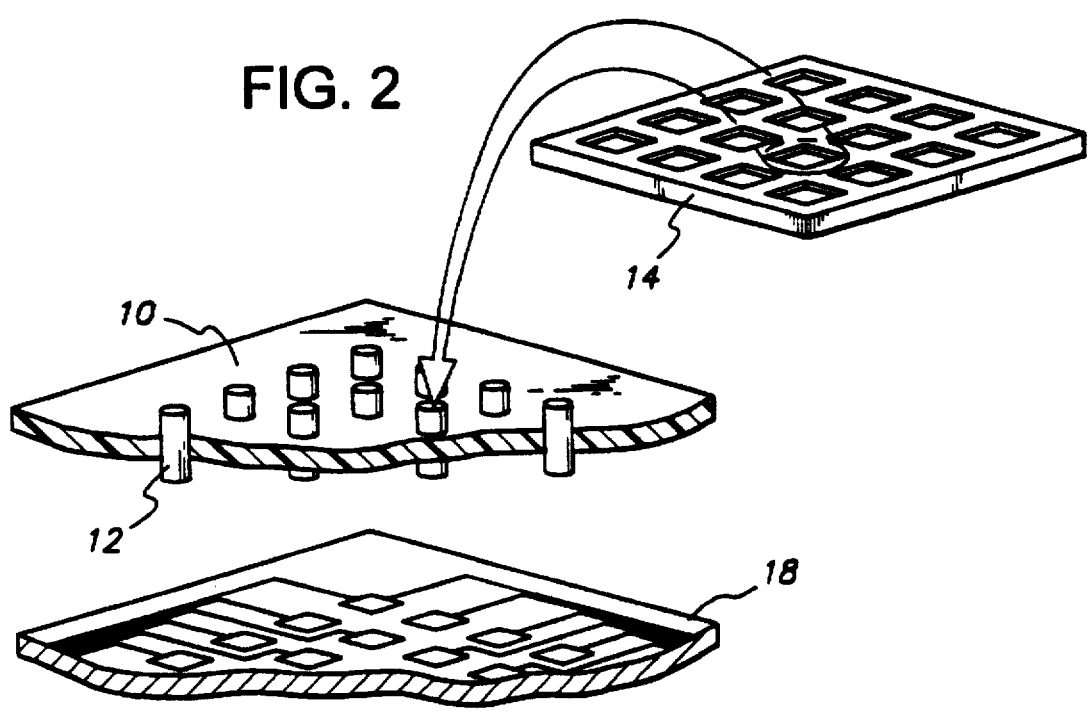
FIG. 2 shows an assembly of a "flip chip" prior to bonding to a uniaxially conductive article according to the present invention.
Figure 5:
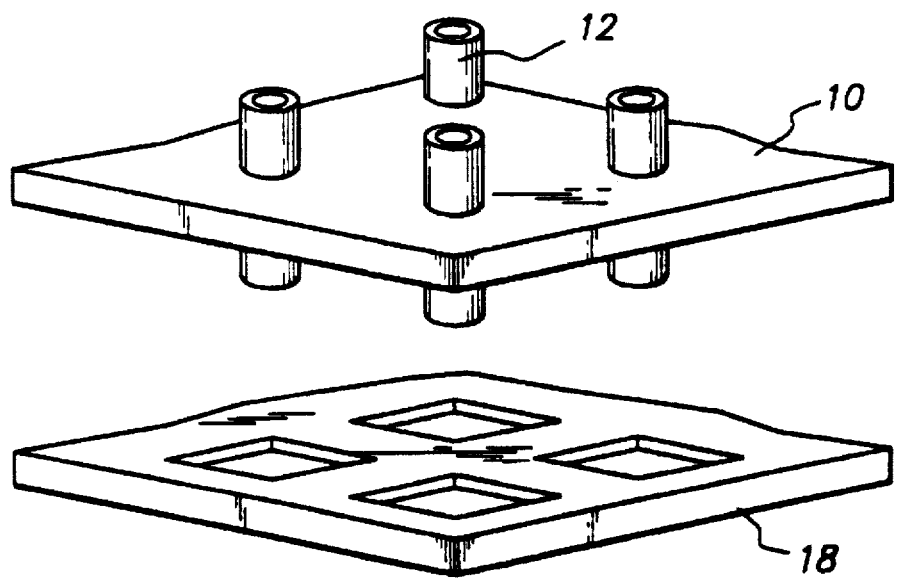
FIG. 5 illustrates an assembly ready for thermocompression bonding of the projecting plated tubular metal uniaxial conductors to an unbumped integrated circuit chip according to the present invention.
Figure 6:
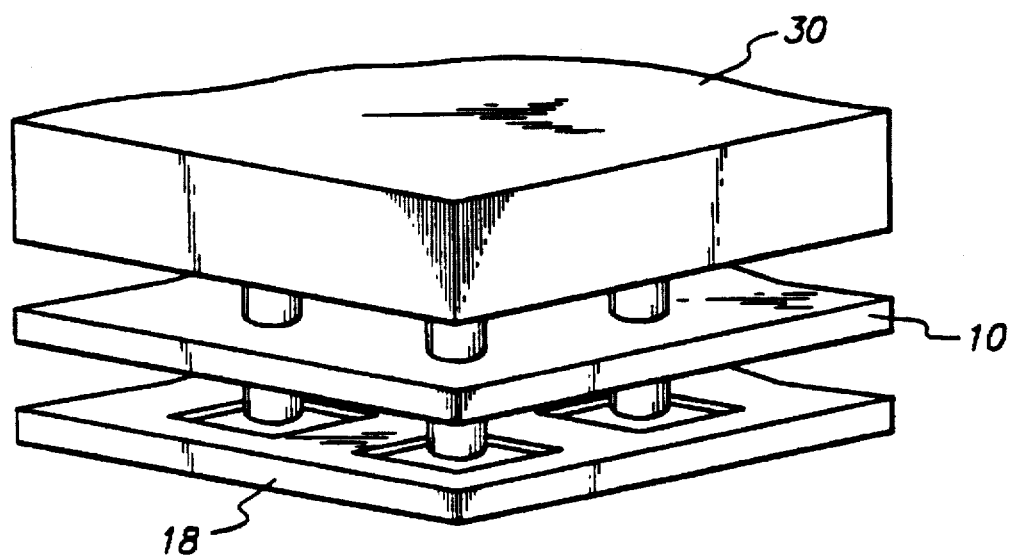
FIG. 6 shows the FIG. 5 assembly being bonded by thermocompression.

These drawings, provided by way of example to illustrate aspects of the invention, will be self-explanatory to those familiar with microcircuit technology.

DESCRIPTION OF THE PREFERRED EMBODIMENTS

The uniaxial sheets act as stand-offs, tending to reduce the shear stress at the bond interfaces, and calculations suggest that significant increases in working lifetime over solder bumps may be achievable. We have achieved thermocompression joining to normal Al—1% Si pad material deposited on Si, with no special chip preparation by means of a uniaxial sheet having 2 micrometers of gold plated on tubular copper linings in the through-holes.

THICKNESS OF FOLD

The invention accordingly includes a uniaxially electrically conductive article comprising electrically insulating sheet material 10 with through-holes individually containing electrically conductive material 12 which provides an electrically conductive path between the main surfaces of the sheet material, the surface of the electrically conductive material which is exposed to contact comprising at least 2 micrometers thickness of gold.

Preferably, the gold is plated on at least part of a tubular formation of another metal plated in the through-holes, which through-holes are preferably not more than 200 micrometers in diameter. Gold plating techniques are described, for example, in "Gold Plating Technology" by F. H. Reid & W. Goldie, Electrochemical Publications Limited (1974). To obtain the desired thickness of at least 2 micrometers gold, it is preferred to use electroless methods in which gold is deposited onto copper or nickel electrolessly deposited layers without depositing on the polymer sheet 10, but other methods, for example thick-film deposition from pastes introduced into the through-holes, may be used if acceptable results are produced. The polymer sheet material will be selected to withstand the chosen metal-deposition techniques.

DIFFERENT BONDS AT OPPOSITE ENDS

Another aspect of the invention provides an anisotropically (preferably substantially uniaxially) electrically conductive article comprising electrically insulating sheet material and electrically conductive material 12 providing electrically separate conductive paths within (preferably close-fitting within holes in) the sheet material between the opposed main surface regions thereof, wherein Case (a) the conductive material at one end of the paths (preferably projecting beyond one of the sheet surface regions) is bondable by thermocompression, and the conductive material (which may be the same or different) at the other end of the paths is bondable by solder, and/or Case (b) the conductive material at one end of the paths is bondable at a temperature lower than the minimum bonding temperature of the conductive material at the other end of the paths.

References to "solder" include low-melting-point metals and alloys which can be used in ways similar to commercially available solders.

As implied by the term "anisotropically conductive", the articles in question may conduct electricity in more than one plane, for example by way of conductive paths running parallel to the sheet surfaces either within or on the sheet in addition to those extending from one surface region to the other within the sheet. However, it is often most useful for the article to be substantially uniaxially conductive with the conductive paths extending within the sheet material substantially only from one surface region to the other, preferably substantially straight and normal to the sheet surfaces, although non-linear paths and/or other angles to the sheet surfaces are possible.

It is usually convenient for the sheet material to have through-holes lined with the conductive material, and the conductive material in each through-hole is preferably electrically separate from that in the other through-holes. The through-holes may be internally plated with a tubular formation of metal to provide at least part of the conductive paths, for example by the plating methods described in the aforementioned European, British and International patent applications.

Preferably the thermocompression-bondable material of case (a) above comprises gold metal and the solder-bondable material may comprise gold or may comprise at least one other metal. In the latter case, it is preferred that the conductive paths comprise at least one metal which is not thermocompression-bondable carrying at least two micrometers thickness of the gold metal at the thermocompression-bondable end.

In all cases, the conductive material may carry solder (applied by known methods) for bonding the solder-bondable ends of the path, but it may be preferably in many practical applications to effect the solder bonding by reflow of solder carried by the substrate to which the article is to be solder-bonded, for example a solder-bumped microchip or inter-connect device 18.

In some forms of the articles according to the invention the solder-bondable conductive material projects beyond the other sheet surface region; while in other forms the solder-bondable conductive material ends in a recess below the level of the sheet surface in the sense that it ends sufficiently far below the surface to avoid making electrical contact with an electrically conductive member when a surface of that member which is wider than the recess is brought into contact with the sheet surface so as to lie across the recess. In the latter case bonding may be effected by flow of solder into the recesses to contact the conductive material therein, for example from solder-bumped chips of interconnect devices.

An article according to the invention may be designed for making electrical connections to a predetermined pattern of connection sites on a first substrate when arranged in face-to-face alignment with a corresponding pattern of connection sites on a second substrate, the article having a pattern of the said conductive paths corresponding to the said patterns of connection sites to make electrical connections between facing pairs of the connection sites when the sheet material in use is arranged between the substrates with the conductive material at the respective ends of each path in contact with its corresponding pair of connection sites. Alternatively, an article could be designed at least a portion of which has at least 25 of the conductive paths per square millimeter of the sheet surface. Such an article, especially at higher path densities per square millimeter, could be used to provide microelectronic connections in the manner described in the aforementioned European application, i.e. without the pattern of conductive paths having to correspond accurately with the connection sites on other substrates. Preferably in all cases some (more preferably substantially all) of the conductive paths are not more than 200 micrometers in diameter.

This aspect of the invention includes an assembly wherein an article of the kind (a) hereinbefore described has the thermocompression-bondable ends of at least some of the conductive paths thermocompression-bonded to connection sites on an integrated circuit semiconductor device by heated thermode bonder 30. Such an assembly may be useful in manufacturing a further assembly or device in which the said article has the solder-bondable ends of at least some of the conductive paths solder bonded to microelectronic interconnect circuitry. Also included is an alternative assembly wherein the said article has the thermocompression-bondable ends of at least some of the conductive paths thermocompression-bonded to micro electronic interconnect circuitry, which could be useful in manufacturing an alternative further assembly or device wherein the said article has the solder-bondable ends of at least some of the conductive paths solder bonded to connection sites on an integrated circuit semiconductor device. The integrated circuit devices referred to could for example be silicon or gallium arsenide microchips for "flip chip" mounting in an interconnect circuitry package. The interconnect circuitry could for example be a fan-out circuit board, multi-chip module, or another microchip, for example a "mirror" chip as described in the aforementioned British Application 8802565. It is an advantage of the articles according to this aspect of the present invention that thermocompression-bonds are relatively permanent, while the solder-bonded ends of the conductive paths can be relatively easily disconnected to permit replacement of defective components without destroying the whole assembly.

The anisotropically (preferably uniaxially) conductive articles according to this aspect of the invention may be fabricated using any of the structures and/or methods and/or materials described in any of the aforementioned European, British and International applications, with the thermocompression-bondable material (and the solder if present) being applied during or after the other fabrication steps. The following description will refer to gold, this being the preferred thermocompression-bondable material, although other materials can be used, for example copper, aluminium, or indium, with suitable bonding sites.

Thus permanent bonding of a chip or other active device (e.g. optical detector array) to a chip carrier, printed circuit board, hybrid board, second chip or other interface circuitry/device can be advantageously effected by the aforementioned aspects of the present invention, with the potential advantages over known wire bonding, TAB, and flip chip techniques of low vertical profile, reduced shear stress on thermal cycling, small footprint, and rapid bonding of many connection sites.

Embodiments of this aspect of the invention will now be described by way of example with reference to the accompanying drawings, FIGS. 7, 8, 9, and 10.

Figure 7:
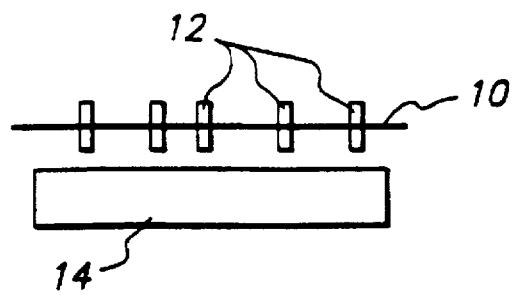
FIG. 7 shows schematically a uniaxially conductive sheet according to the invention and an integrated circuit microchip to be bonded thereto.

Referring to FIG. 7, the electrically insulating polyimide sheet 10 of an article according to the present invention carries electrically conductive plated nickel-on-copper tubes 12 (greatly enlarged for clarity) which provide the conductive paths projecting from both surfaces of the sheet. The upper ends (as illustrated) of the copper tubes are the plated solder-bondable nickel, while the lower ends are overplated with thermocompression-bondable gold to a thickness of 3 micrometers. The gold-plated ends of the tubes 12 are aligned for bonding to aluminium bonding sites (not shown) on an integrated circuit microchip 14.

Figure 8:
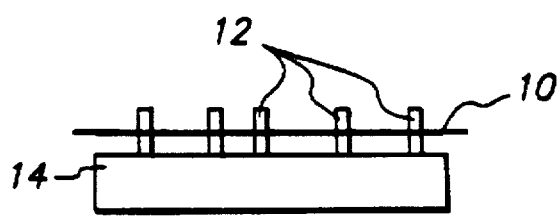
FIG. 8 shows schematically the sheet and chip after bonding.

In FIG. 8, the gold-plated ends of the tubes 12 have been bonded to the pads of the chip 14 by known thermocompression bonding techniques.

Figure 9:
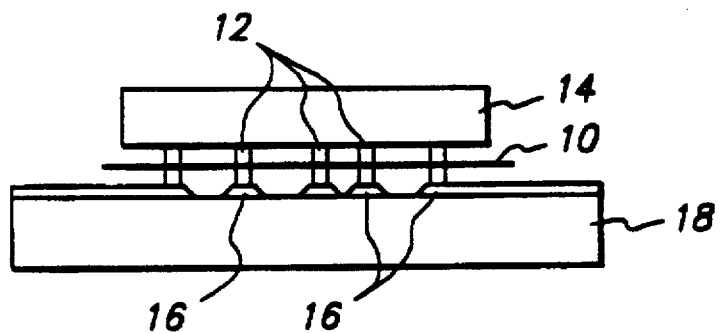
FIG. 9 shows schematically the inverted assembly of sheet and chip bonded to a fanout circuit board.

In FIG. 9, the assembly of the chip 14 with the uniaxially conductive article bonded thereto has been inverted ("flip chip") and the solder-bondable ends of the metal tubes have been soldered by known techniques to bonding sites 16 on a fan-out circuit board 18.

Figure 10A:
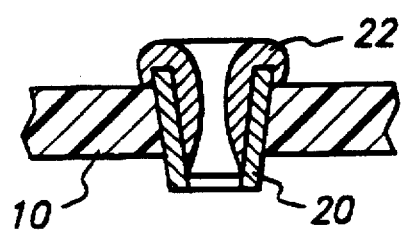
FIGS. 10A and 10B show schematic enlargements of two forms of plated through-holes capable of providing the conductive paths through the sheet of FIGS. 7 to 9.
Figure 10B:
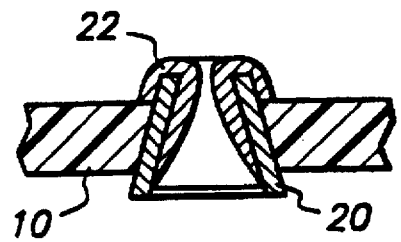

FIGS. 10A and 10B respectively show in enlarged schematic cross-section one of the through-holes in the sheet 10 which has been plated with copper and then with nickel to form a tapered tube 20 of metal. Surface layers have been removed from the sheet after the plating to leave the tapered metal tubes 20 projecting from both sheet surfaces, as described in the aforementioned European, British and International applications.

In the preferred methods of forming the through-holes by laser ablation, as described in the aforementioned European, British and International applications, the holes, and therefore the plated metal tubes, are usually somewhat tapered, as shown. Thermocompression-bondable gold layer 22 illustratd in FIG. 10A has been plated on the wider end of the tapered tube 20, while FIG. 10 illustrates the alternative plating of the gold 22 on the narrower end of the tapered tube 20. The gold plating 22 neet not extend as far into the tube 20 as illustrated. The tube 20 could carry solder at its other (not gold-plated) end, which solder could partially fill the tube 20. Preferably the temperatures used for thermocompression bonding the gold-plated end would not prematurely melt the chosen solder.

When it is desired to place thermocompression-bondable material (or solder) on only one end of the conductive paths, this is easily achieved for example, by masking all the other side of the sheet with a suitable resist, electrolessly plating the material, e.g. gold (or metal coating the solder) on the exposed ends of suitable metal e.g. copper-nickel passing through the sheet, then removing the resist to expose the unplated (or unsoldered) ends of the paths. The unplated (unsoldered) ends may then be similarly provided with an appropriate bonding material, preferably a solder having a lower melt temperature than the material applied to the first ends, which may be thermocompression-bondable in the aforesaid case (a), or another solder in case (b).

This aspect of the invention includes a method of making electrical connections wherein an anisotropically electrically conductive article according to the aforesaid case (a) is thermocompression bonded to electrical conductors at one end of the paths, and is solder bonded to electrical conductors at the other end of the paths, or wherein an anisotropically electrically conductive article according to the aforesaid case (b) is solder bonded to electrical conductors at one end of the paths by solder having a first minimum bonding temperature, and is solder bonded to electrical conductors at the other end of the paths at a temperature below the first minimum bonding temperature by solder having a second minimum bonding temperature which is lower than the first minimum bonding temperature.

Preferably, the higher-temperature bonding material will be able to survive the exposure to lower temperatures involved in bonding the lower temperature ends.

Two different tin/lead solders could for example be used to provide the different solder bonding temperatures. Thermocompression bonding is preferably conducted at significantly higher temperatures than solder-bonding.

EXAMPLE 1GS

A sample of the uniaxially conducting material was prepared with a 2 micron gold plating layer on the protruding tubes both above and below the polyimide layer. An integrated circuit with aluminium bond pads was placed face upwards on a Farco Tape Automated (Thermocompression) Bonder (model F120), and the uniaxially conducting material was then aligned over the top of the chip so that the tubes were above the bond pads. Once aligned, the thermode was brought into contact with the uniaxially conducting material, the thermode temperature raised to 350 celsius during the application of pressure for approximately 2 seconds in order to form a thermocompression bond. At this stage the integrated circuit was bonded to the sheet of uniaxially conducting material. The sub-assembly was then 'flipped' so as to bring the side of the uniaxially conducting material not yet used for bonding into contact and alignment with a circuit board. The tracks on the circuit board has previously been solder tipped with an 80% gold—20% tin solder which forms a good solder bond to gold metallisations. The stage on which the circuit board was held was heated so as to raise the temperature of the solder above its melting point i.e. greater than 280 celsius. Once cooled, a strong solder bond had been achieved between the uniaxially conductive material and the circuit board.

The result of these two bonding stages is an integrated circuit bonded to a circuit board via a sheet of uniaxially conducting material.

SHEET MATERIALS

A preferred polymer material for this and the other aspects of the invention is a polyimide capable of retaining at least 50%, preferably at least 75%, more preferably at least 85%, of its original elongation after immersion in water of pH10 at 100° C. for 4 days according to ASTM D882. It will be readily understood that a sufficiently fully cyclised polyimide having less than 15%, preferably less than 10%, more preferably less than 5%, and if possible substantially no open imide rings or uncyclised amic acid groupings may be better able to survive hot alkaline metal plating baths, which attack incompletely cyclised polyimides such as Kapton (TM). Preferred materials include polyimides derived from polymerisation of 4,4'-biphenyl dianhydride and (4,4'-diaminobiphenyl, or 4,4'-diaminobiphenyl ether, or phenylenediamine).

The currently more preferred commercially available polyimides are those available under the Trade Mark "UPILEX" from Ube/ICI. One of these, "UPILEX R", is believed to be a relatively completed cyclised polymer having a repeat unit derived from biphenyl dianhydride and diaminodiphenylether, viz.

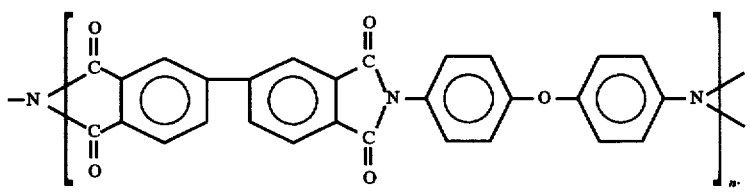

Most preferred, however, is "UPILEX S", which is believed to have a repeat unit derived from the same anhydride and phenylene diamine, viz.

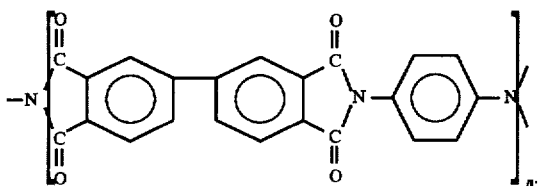

The polyimide of the 4,4'-diaminobiphenyl has thermal expansion/contraction characteristics which may render it particularly suitable for use with microcircuit chips and circuit boards.

Appropriate forms of uniaxially conductive sheet for the various embodiments of the present invention may be made, for example, by the methods and materials described in the aforementioned EP-A-0213774 or copending applications, the respective disclosures of which are incorporated herein by reference.

DIMENSIONS AND CONDUCTIVITY

The diameter and distribution of the through-holes will preferably be such that the through-holes occupy from 3 to 35 percent, more preferably 10 to 20 per cent, of the sheet surface area. Through-holes of less than 500, preferably less than 200, e.g. 5 to 150, micrometers diameter are preferred. A sheet with at least 25 through-holes per square millimeter having plated electrically conductive material (metal) within (preferably substantially only within) the through-holes is especially useful, the through-holes thus providing high density electrically conductive paths between the sheet surfaces, each such path being electrically separate from substantially all the other paths.

While a "significant proportion" of the through-holes in the selected areas, for example at least 10%, preferably at least 20%, more preferably at least 30% or better still at least 40%, may contain the conductive material, it is preferred that a majority (more than 50%) do so. Proportions of at least 70%, or better still at least 85% are preferred, and in many cases, substantially all of the through-holes will contain the conductive material. The through-holes, whether containing the conductive material or not, may be confined to selected areas of the sheet.

The through-holes in "one-to-one" or in "multitudinous" uniaxial sheets may for example be 1 to 200 micrometers in diameter, and it is also preferable in some cases that the conductive material project beyond both main surfaces of the sheet material, the projections from either surface preferably being, for example, 0.2 to 100 micrometers in height, preferably 0.5 to 30 micrometers.

The insulating sheet material will preferably be a flexible polymeric material, and the number of through-holes per square millimeter of the sheet material (whether flexible polymeric or not) may be as high as 10000, but will preferably be in the range from 25 to 2000, more preferably 50 to 1000. The through-holes will preferably have a tortuosity factor (mean path length/sheet thickness) less than 3, preferably less than 1.2; and will preferably have an aspect ratio (length/diameter) of at least 2.5.

Although the "electrically conductive" paths between the sheet surfaces may give the sheet an average electrical conductivity in the thickness direction within the semiconductive range, it is preferable to achieve generally metallic levels of conductivity e.g. at least 1000 Siemens per centimeter, preferably at least 5000 Siements, especially at least 10000 Siemens per centimeter. The preferred conductive materials are metals, preferably plated, especially electrolessly plated, on the interior surface of the through-holes. Any suitably applicable metals may be used, for example Ni, Cu, Ag, Au, Co, Pd, Pd-Ni, Sn, Pb, Pb-Sn, In.

In some forms of the articles, at least a selected portion of the sheet has a plurality (at least 4, preferably at least 8, more preferably 25 to 1000) of substantially non-interconnected through-holes per square millimeter of its surface, at least a significant proportion of which through-holes individually contain a tubular formation of electrically conductive material projecting beyond at least one of the sheet surfaces.

TUBULAR FORM AND PROJECTION

This and other forms of the invention could be used to provide relatively large "posts" of solder or other fusible metals e.g. indium supported by the tubular formation, for use in making connections to microcircuits. Gold filling material could also be used to make such "permanent" electricial connections, instead of, or in addition to, plated gold.

Preferably, this tubular formation comprises a first poriton of electrically conductive material on the interior through-hole surface, and a second portion of electrically conductive material, on at least one of the end surfaces of the first portion, at least the parts of the second poriton on one or both of the end surfaces of the first portion projecting beyond the sheet surface(s). Preferably, the first portion of electrically conductive material on the through-hole surface is tubular and the second portion of electrically conductive material is on the interior surface as well as the end surface(s) of the first portion. The first portion is preferably metal and is preferably plated, especially electrolessly plated, on the interior through-hole surface, and the second portion is preferably metal plated, especially electrolessly plated, on the first portion. The first and second portions respectively may comprise different electrically conductive materials, and the second portion may fill the tubular first portion or may itself be tubular, in which case it may be filled with further electrically conductive or insulating material. Where the metal-lined through-holes are filled with another metal, this will preferably be a solder, a low-melting-point metal, a fusible alloy, or a plated metal. Either the tubular metal lining, or the metal fillings, or both, may project beyond the sheet surface(s), and the other criteria mentioned above may apply as appropriate.

If desired, electrically insulating material may be removed from one or both surfaces of the sheet material to expose portions of the electrically conductive material originally within the through-holes, thus producing or increasing the desire projections of the conductive material beyond the sheet surface(s). This may be done by any convenient means, for example by dissolving away a surface layer of the sheet material, as described in the aforementioned EP-A-0213774, for which purpose a sheet having surface layers of materials more readily soluble in a selected solvent than the underlying layers may be used, especially the sheets described in copending International Application No. PCT/GB89/00108 entitled "Laminar Polymeric Sheet" (RK362COM).

STRIP FEED

The invention also provides a strip of electrically insulating material carrying two or more arrays of the through-holes containing electrically conductive material as hereinbefore described, the strip preferably being adapted for feeding to suitable processing equipment (e.g. for chip testing, permanent bonding, or heat-sink applications as hereinbefore described) by mechanical, preferably automatic, feed means.

Examples of various permanent bonding aspects of the invention will now be described with reference to the accompanying drawings, FIGS. 11, 12 and 13.

Figure 11:
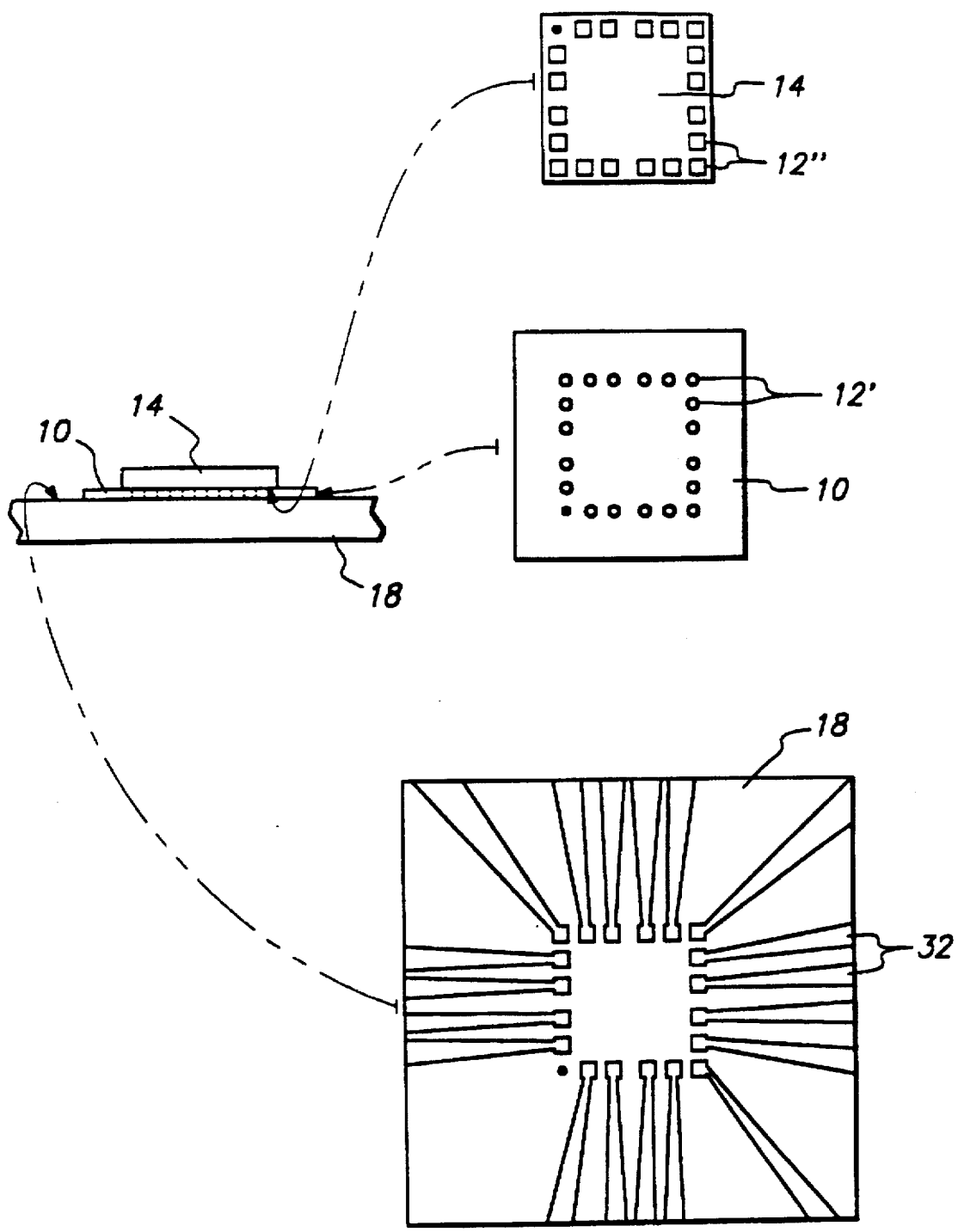
FIG. 11 illustrates schematically permanent attachment of a microchip to associated circuitry by bonding to a uniaxially conductive sheet.
Figure 12:
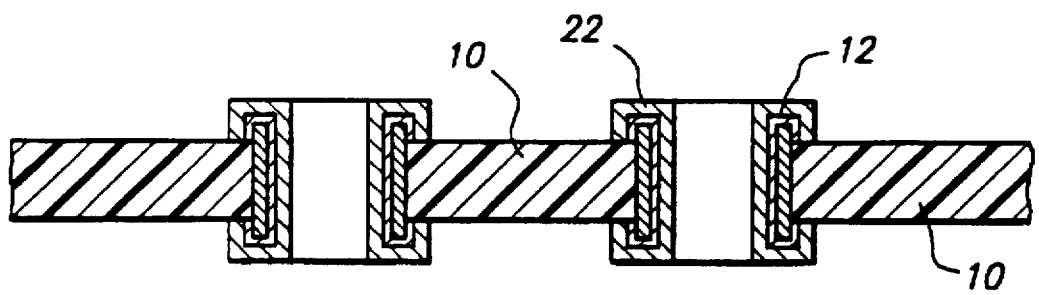
FIG. 12 shows schematically a magnified portion of a uniaxially conductive sheet suitable for permanent bonding as shown in FIG. 11.
Figure 13:
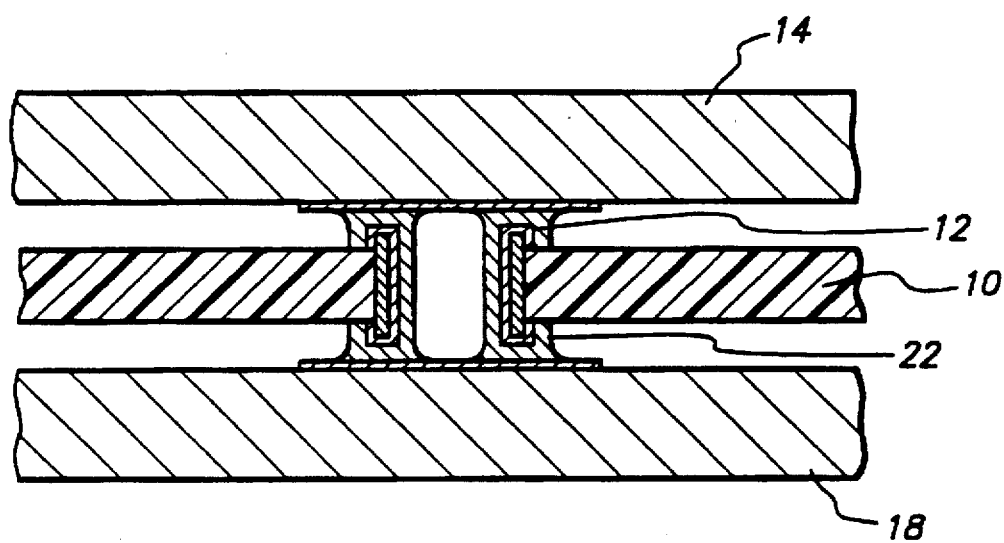
FIG. 13 shows schematically a permanent bond formed by one of the plated through-holes as shown in FIG. 12.
Figure 14:
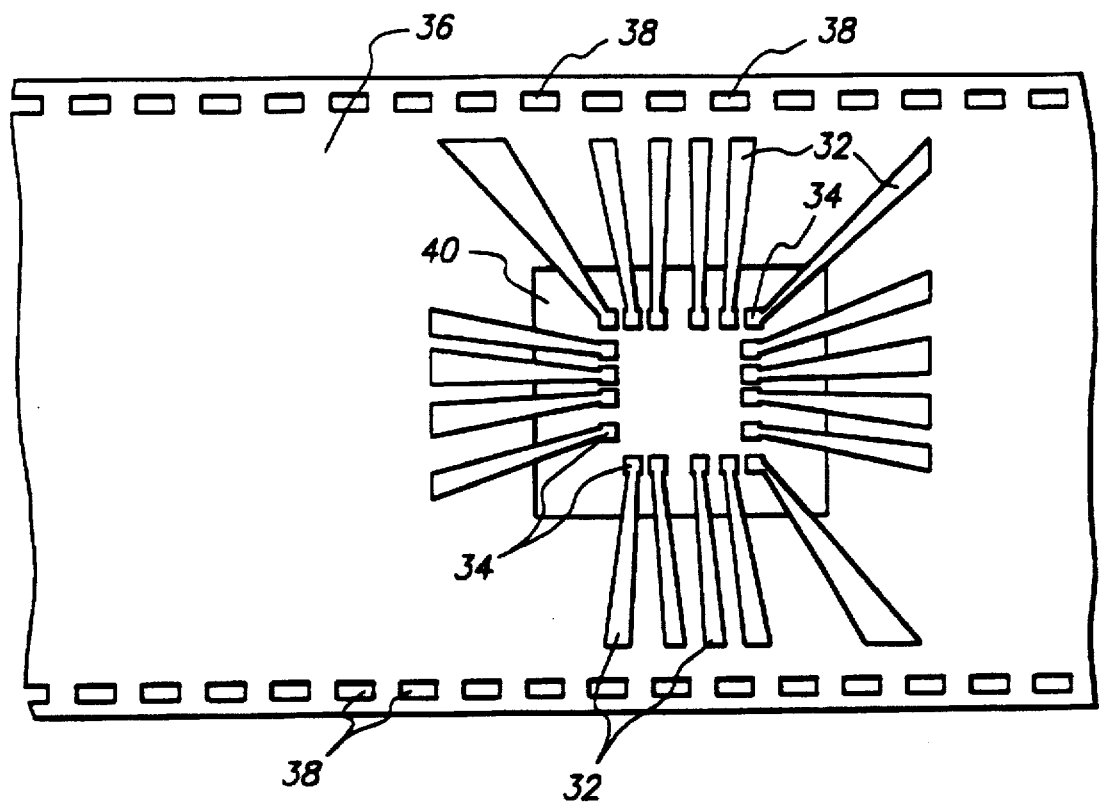
FIG. 14 shows schematically a TAB device.

Referring to FIGS. 11 to 13 thermocompression-bonding was used to fabricate a three layer structure comprising (a) a silicon chip 14, with bonding sites a 12' metallised with aluminium—1% silicon, (b) a sheet of uniaxially conducting material 10, the through-holes 12' of which have been plated with 5 μm copper, 1 μm nickel, 2 μm gold, (c) a silicon substrate 18, metallised with aluminium—1% silicon conductive tracks 32. Two types of uniaxially conducting sheets were evaluated, the first consisting of an area with 35 micrometer diameter tubes in a multi-tube array (not shown), the second consisting of an area containing a small number of specially-positioned 35 micrometer diameter tubes as shwon corresponding to the positions of the bonding sites 12" and conductive tracks 32. Bonding conditions for each case were similar, and typically used a thermode temperature of 350°–500° C. and bonding forces from 80–200N, with a duration of 2–4s. Thermocompression-bonds as illustrated in FIG. 13 were obtained using this method.

The through-holes before bonding are shown in FIG. 12 comprising an electrolessly plated layer of copper, overlaid with nickel and then with gold as aforesaid, the polyamide surface layers originally present on the sheet during the copper plating process having been removed prior to the nickel and gold plating to produce the sheet b shown in FIG. 12 with the metal tubes protruding from it.

In FIG. 13 the structure of FIG. 12PB has been thermocompression-bonded to the chip a and substrate c as aforesaid.

TAB APPLICATIONS

The uniaxial conductor can advantageously be used as a permanent bonding medium in conjunction with TAB (tape automated bonding). TAB is known as a method of achieving electrical connection between a bare chip and a substrate such as a hybrid board, printed circuit board, chip carrier or other package.

Known TAB devices have a structure akin to that shown schematically in the accompanying Sketch A14. A polymer tape 30 having edge sprocket holes 38 for feeding the tape in automated bonding equipment carries a series of arrays (one shown) of conductive tracks 32 arranged in a pattern suitable for bonding their inner ends 34 to the bonding sites of a microchip (not shown). The tape 36 is cut away under the ends 34 of the tracks so that the ends project as unsupported "fingers" over the cut-away space 40. Bonding is effected by bending the fingers into the space 40 to make contact with the chip positioned against the opposite side of the tape from that carrying the tracks. This is followed by bonding by known techniques which often require the chip bonding sites to be "bumped" with bonding material, e.g. solder.

The present invention can avoid such disadvantageous "bumping" processes.

The invention provides a method of making electrical connections between an array of connection sites on an integrated circuit microelectronic device and electrical conductors carried on a film or tape support material with an array of unsupported end portions of the conductors projecting beyond an edge of the support material wherein:

(a) the said end portions of the conductors are respectively aligned with the said connection sites to which connections are to be made, (b) an anisotropically (preferably uniaxially) electrically conductive article comprising electrically insulating sheet material with through-holes containing electrically conductive material which provides an electrically conductive path from one of the main surface regions of the sheet material to the other is positioned with the respective ends of at least one such path aligned between each connection site and the conductor end portion aligned therewith, and (c) the ends of the path(s) so aligned are bonded respectively to the connection sites and to the conductor end portions.

The uniaxially conductive article for use with TAB articles according to the present invention maybe in any appropriate form among those described in the aforementioned copending Applications or in European Published Application EP-A-0213774, the disclosures of all of which are incorporated herein by reference. The uniaxially conductive articles may be made using any of the methods and/or materials disclosed in those copending or published applications. The invention includes the use of a TAB article or process with any novel sub-set or sub-combination of the aforesaid forms, methods of materials.

Figure 15:
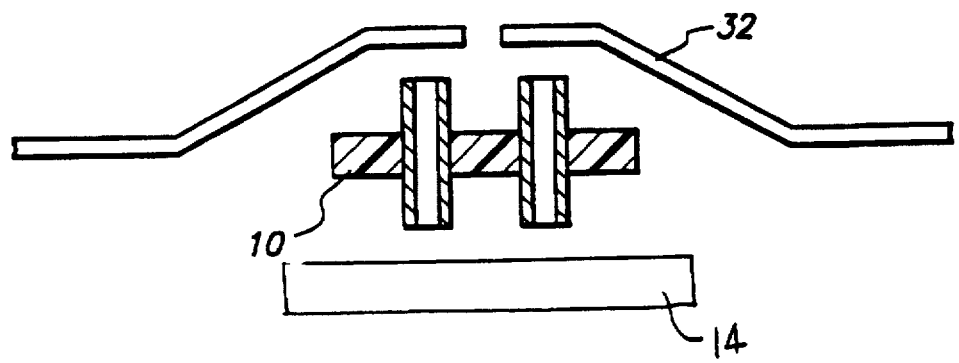
FIG. 15 shows two pated metal tubes projecting from a uniaxially conducting article.
Figure 16:
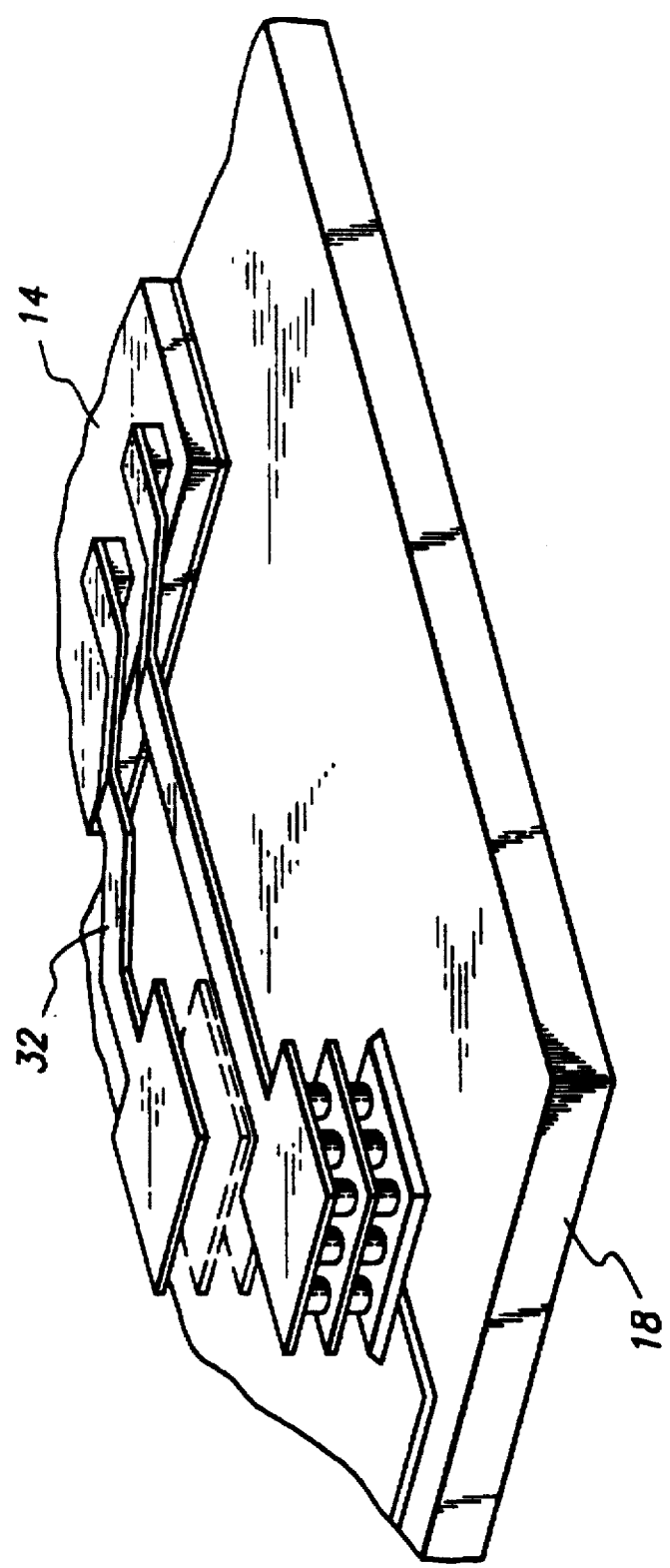
FIG. 16 illustrates thermocompression (TC) bonding of the outer track ends of a TAB device.
Figure 17:
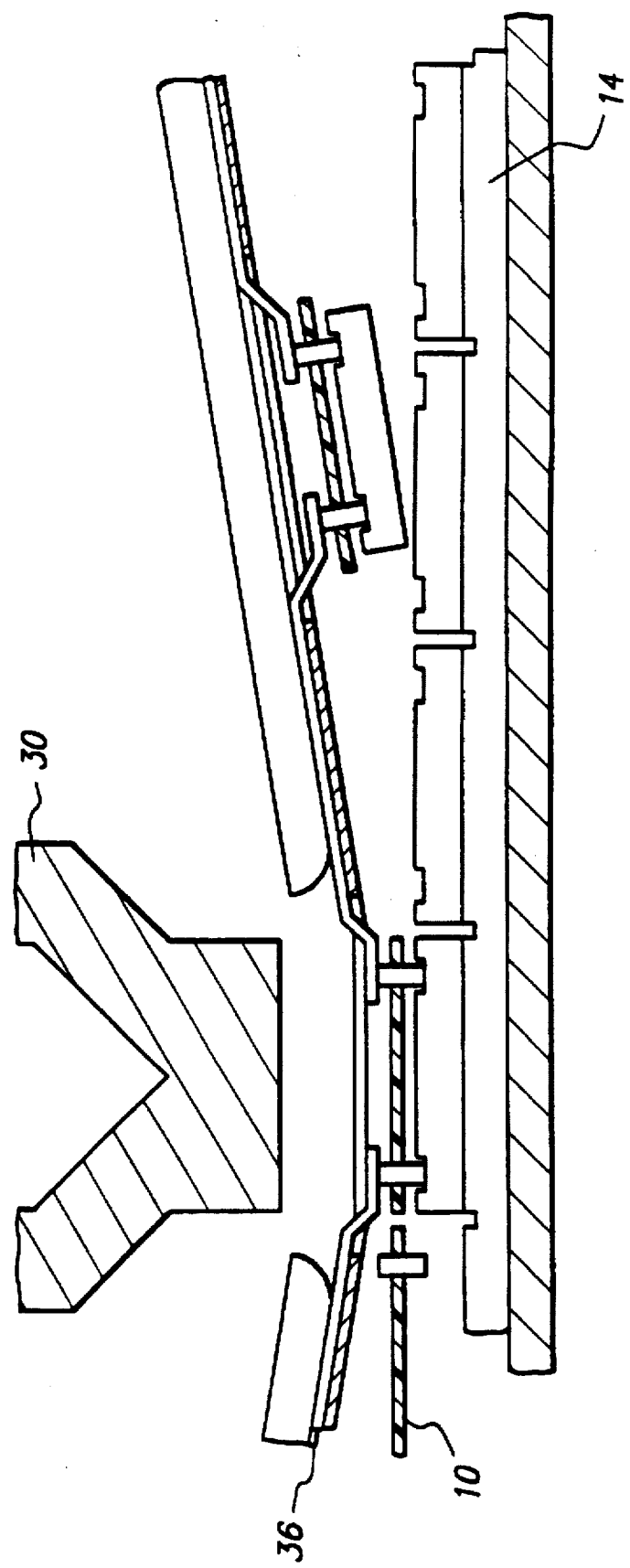
FIG. 17 shows a TAB production line.

These and other aspects of the invention are further illustrated by the accompanying schematic drawings, FIGS. 15, 16 and 17.

FIG. 15 shows two plated metal tubes projecting from a uniaxially conducting article made by the aforesaid methods aligned with the ends of conductive tracks by a TAB device.

FIG. 16 illustrates thermocompression (TC) bonding of the outer track ends of a TAB device using multi-tube uniaxially conductive articles as described in the aforementioned EP-A-0213774; and FIG. 17 shows a TAB production line bonding TAB tracks to a series of unbumped integrated circuit chips.

Figure 18:
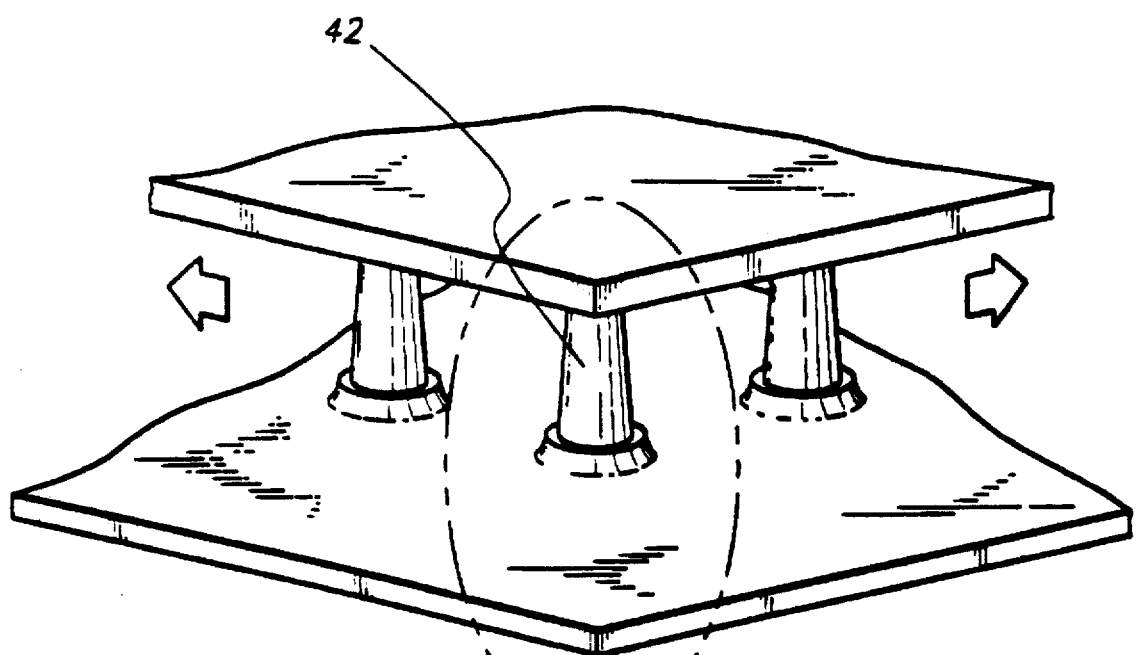
FIG. 18 illustrates connections made by fusible metal columns.
Figure 18A:
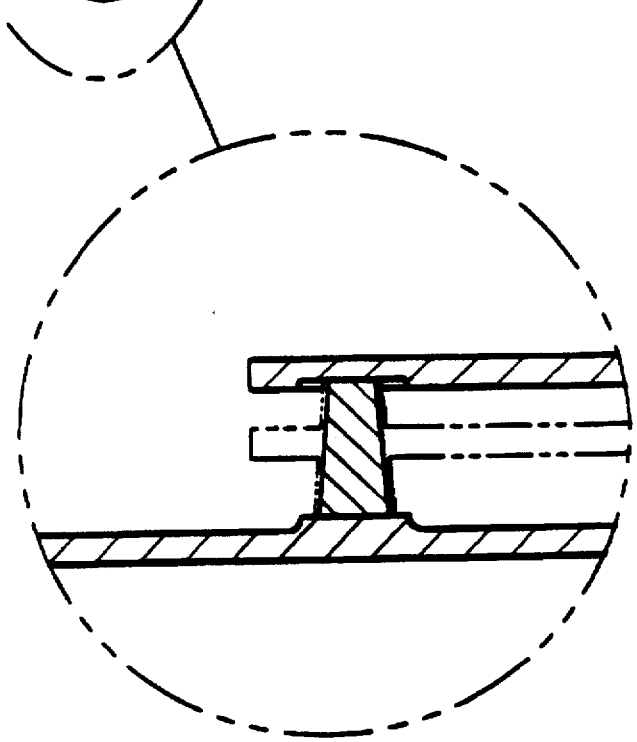

FIG. 18 illustrates connections made by fusible metal (e.g. solder, gold, indium) columns 42 presented in a uniaxially conductive article from which the polymeric carrier sheet (dotted lines in inset) has been removed, e.g. by a suitable solvent after bonding of the columns. Such columns could be used in devices embodying various aspects of the present invention, and may be especially useful in high-density arrays of interconnections, for example a closely-packed array of "III" interconnections, having one such column for each pair of opposed bonding sites. The columns are made, for example, by filling the initial plated metal tubes with molten metal, and allowing the molten metal to solidify. The thin tubular plating but may remain as a surface layer thereon. Solid columns of other metals may be similarly made, and the filling metal may be the same as or different from the plating metal.

We claim:

1. A method of making electrical connections between an array of connection sites on an integrated circuit microelectronics device and electrical conductors carried on a tape support material with an array of unsupported end portions of the conductors projecting beyond an edge of the support material, wherein:

(a) said end portions of the conductors are respectively aligned with said connection sites to which connections are to be made, (b) an anisotropically electrically conductive article comprising electrically insulating sheet material with through-holes containing electrically conductive material which provides an electrically conductive path from one of the main surface regions of the sheet material to the other is positioned with the respective ends of at least one such path aligned between each connection site and the conductor end portion aligned therewith, and (c) the ends of the path(s) so aligned are bonded respectively to the connection sites and to the conductor end portions.

2. A method according to claim 1 wherein the conductive material at one end of said paths is bondable by thermocompression, and the conductive material at the other end of said paths is bondable by solder, and the respective ends are bonded by thermocompression and by solder in step (c).

3. A method according to claim 2 wherein the conductive material at one end of said paths projects beyond one of the sheet surface regions.

4. A method according to claim 2 wherein the solder bondable conductive material projects beyond the adjacent sheet surface region.

5. A method according to claim 2 wherein the solder-bondable conductive material ends in a recess below the level of the sheet surface in the sense that it ends sufficiently far below the surface to avoid making electrical contact with an electrically conductive member when a surface of that member which is wider than the recess is brought into contact with the sheet surface containing the recess so as to overlie the recess.

6. A method according to claim 2 wherein the thermocompression-bondable ends of at least some of the conductive paths are thermocompression-bonded to connection sites on the said integrated circuit semiconductor device.

7. A method according to claim 6 wherein the solder-bondable ends of at least some of the conductive paths are solder bonded to microelectronics interconnect circuitry.

8. A method according to claim 2 wherein the thermocompression-bondable ends of at least some of the conductive paths are thermocompression-bonded to microelectronics interconnect circuitry.

9. A method according to claim 8 wherein the solder-bondable ends of at least some of the conductive paths are solder bonded to connection sites on an integrated circuit semiconductor device.

10. A method according to claim 2 wherein the thermocompression-bondable material comprises gold metal and the solder-bondable material comprises at least one other metal.

11. A method according to claim 10 wherein the conductive paths comprise at least one metal which is not thermocompression-bondable carrying at least two micrometers thickness of gold metal at one or both ends.

12. A method according to claim 2 wherein said conductive article has gold metal at both ends of said paths.

13. A method according to claim 12 wherein the conductive paths comprise at least one metal which is not thermocompression-bondable carrying at least two micrometers thickness of gold metal at one or both ends.

14. A method according to claim 2 wherein the conductive material carries solder for bonding the solder-bondable ends of the paths.

15. A method according to claim 1 wherein said conductive article is substantially uniaxially conductive.

16. A method according to claim 1 wherein said sheet material has through-holes therein containing the electrically conductive material.

17. A method according to claim 16 wherein the conductive material in each through-hole is electrically separate from that in the other through-holes.

18. A method according to claim 1 wherein the through-holes are internally plated with a tubular formation of metal.

19. A method according to claim 1 wherein at least a portion of said conductive article has at least 25 of the conductive paths per square millimeter of the sheet surface.

20. A method according to claim 1 wherein the conductive material at one end of said paths projects beyond the main sheet surface and is overplated with metal such that it is bondable at a temperature lower than the minimum bonding temperature of the conductive material at the other end of said paths.

21. A method according to claim 20 wherein the bondable material comprises a first solder at one end of said paths and a second solder at the other end of said paths.

22. A method according to claim 21 wherein said electrically conductive article is solder bonded to electrical conductors at one end of said paths by solder having a first minimum bonding temperature and is bonded to electrical conductors at the other end of said paths at a temperature below said first minimum bonding temperature by solder having a second minimum bonding temperature which is lower than the first minimum bonding temperature.

23. A method according to claim 22 wherein the gold is plated on at least part of a tubular formation of another metal plated in the through-holes.

24. A method according to claim 20 wherein said electrically conductive article is thermocompression bonded to electrical conductors at one end of said paths, and is solder bonded to electrical conductors at the other end of said paths.

25. A method according to claim 1 wherein said electrically conductive article, the surface of the electrically conductive material which is exposed to contact comprises at least 2 micrometers thickness of gold.

26. A method according to claim 1 wherein said insulating sheet material is a polyimide derived from polymerization of 4,4'-biphenyldianhydride and a diamine selected from the group consisting of 4,4'-diaminobiphenyl, and 4,4'diaminobiphenyl ether, and phenylenediamine.

27. A method according to claim 1 wherein at least some of the conductive paths are not more than 200 micrometers in diameter.

28. A method according to claim 27 wherein at least some, of the conductive paths are not more than 100 micrometers in diameter.

29. A method according to claim 1 wherein said holes are made by laser drilling.

30. A method according to claim 29 wherein the laser drilling is U.V. laser ablation.

31. A method according to claim 1, wherein said holes have a taper relative to the hole axis of less than 10°.

* * * * *